US006933871B2

(12) United States Patent
Melanson et al.

(10) Patent No.: US 6,933,871 B2
(45) Date of Patent: *Aug. 23, 2005

(54) FEEDBACK STEERING DELTA-SIGMA MODULATORS AND SYSTEMS USING THE SAME

(75) Inventors: John Laurence Melanson, Austin, TX (US); Xiaofan Fei, Austin, TX (US); Johann G. Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 142 days.

This patent is subject to a terminal disclaimer.

(21) Appl. No.: 10/379,742

(22) Filed: Mar. 5, 2003

(65) Prior Publication Data

US 2005/0116849 A1    Jun. 2, 2005

Related U.S. Application Data

(63) Continuation-in-part of application No. 10/217,368, filed on Aug. 13, 2002, now Pat. No. 6,724,332, and a continuation-in-part of application No. 09/954,776, filed on Sep. 17, 2001, now Pat. No. 6,556,159.

(51) Int. Cl.[7] .............................................. H03M 3/00
(52) U.S. Cl. ....................................... 341/143; 341/144
(58) Field of Search .................................. 341/143–144, 341/155

(56) References Cited

U.S. PATENT DOCUMENTS

| 5,012,244 | A | 4/1991 | Wellard et al. |
| 5,243,345 | A | 9/1993 | Naus et al. |
| 5,248,972 | A | 9/1993 | Karema et al. |
| 5,659,314 | A | 8/1997 | Tokura et al. |
| 6,011,501 | A | 1/2000 | Gong et al. |
| 6,087,969 | A | 7/2000 | Stockstad et al. |
| 6,150,969 | A | 11/2000 | Melanson .................... 341/143 |
| 6,255,975 | B1 | 7/2001 | Swanson |
| 6,304,608 | B1 | 10/2001 | Chen et al. .................. 375/252 |
| 6,340,940 | B1 | 1/2002 | Melanson |
| 6,362,763 | B1 | 3/2002 | Wang |
| 6,556,159 | B1 | 4/2003 | Fei et al. ..................... 341/143 |

Primary Examiner—Michael Tokar
Assistant Examiner—Khai Nguyen
(74) Attorney, Agent, or Firm—Thompson & Knight LLP; James J. Murphy

(57) ABSTRACT

A digital to analog converter including an input for receiving an input signal, a ramp generator, and a delta-sigma modulator responsive to the input signal and an output of the ramp generator. An order of a noise shaping transfer function of the delta-sigma modulator is response to a level of the output of the ramp generator.

22 Claims, 6 Drawing Sheets

FEEDBACK STEERING DELTA-SIGMA MODULATORS AND SYSTEMS USING THE SAME

CROSS-REFERENCE TO RELATED APPLICATION

This application for patent is a continuation-in-part of the following patent applications::

U.S. Ser. No. 10/217,368 is now a U.S. Pat. No. 6,724,332 entitled "Noise Shaping Circuits and methods with Feedback Steering Overload Compensation and Systems Using the Same", by inventor John Melanson, filed Aug. 13, 2002; and U.S. Ser. No. 09/954,776 filed Sep. 17, 2001 is now a U.S. Pat. No. 6,556,159 by Fel, Gaboriau, and Melanson, entitled "Variable Order Modulator."

BACKGROUND OF INVENTION

1. Field of the Invention

The present invention relates in general to mixed signal processing and, in particular, to delta-sigma modulation.

2. Background of the Invention

Delta-sigma modulators are particularly useful in digital to analog and analog to digital converters (DACs and ADCs), as well as codecs and similar mixed signal applications. Generally, delta-sigma modulators, which can operate on either an analog or digital input, generate a quantized output that tracks the average of the input signal. Using oversampling, the delta-sigma modulator spreads the quantization noise power across an oversampling frequency band, which is typically much greater than the input signal bandwidth. Additionally, delta sigma modulators perform noise shaping by acting as a highpass filter to the noise such that most of the quantization noise power is shifted out of the signal band of interest.

The typical delta sigma modulator sums the input signal with negative feedback, performs a linear filtration operation and then a one-bit or multiple-bit quantization. In a first order modulator, the linear filter includes a single integrator stage while the filter in a higher order modulator has a cascade of a corresponding number of integrator stages. Higher order modulators have the advantage of improved noise shaping capability over lower order modulators, although stability becomes a more critical consideration as the order is increased.

During device power-up and power-down, discontinuities can appear in the delta-sigma modulator output. In audio applications, these discontinuities manifest themselves as audible clicks and pops to the listener. Hence, "pop-guard" techniques are typically employed in low-end audio delta-sigma DACs, such as those used to drive headphones and inexpensive speakers.

One common pop-guard technique ramps-up and ramps-down the modulator input during power supply transitions to minimize output discontinuities. For a single-ended modulator configuration, the "quiet" signal level is typically in the middle of the power supply voltage range. Thus, for this configuration, the target is to ramp the output to and from this mid-range voltage level by corresponding ramping of the input voltage.

As further discussed below, to maintain modulator stability, the peak-to-peak output relative to the power supply rails is limited, which consequently limits the ability of the modulator to smoothly ramp the output from the power supply rails. This limitation can itself cause discontinuities in the output and is therefore a significant problem, which must be addressed.

SUMMARY OF INVENTION

The principles of the present invention advantageously reduce or eliminate output transients which typically occur when the input to a delta-sigma modulator ramps-up or ramps-down, such as during system power-up and power-down. According to one particular embodiment of these principles a digital to analog converter is disclosed which includes an input for receiving an input signal, a ramp generator, and a delta-sigma modulator responsive to the input signal and an output of the ramp generator. An order of a noise shaping transfer function of the delta-sigma modulator is response to a level of the output of the ramp generator.

Advantageously, circuits, systems, and methods embodying the inventive principles allow a delta-sigma modulator to remain stable, even when the input data stream ramps to a maximum or minimum value which would otherwise cause the modulator to overload. In audio systems, pops and clicks during power-up and power-down, as well as during transitions to and from minimum and maximum volume settings, are reduced since the modulator is kept stable until the input signal has settled within normal operating limits.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–7 of the drawings, in which like numbers designate like parts.

Figure 1:
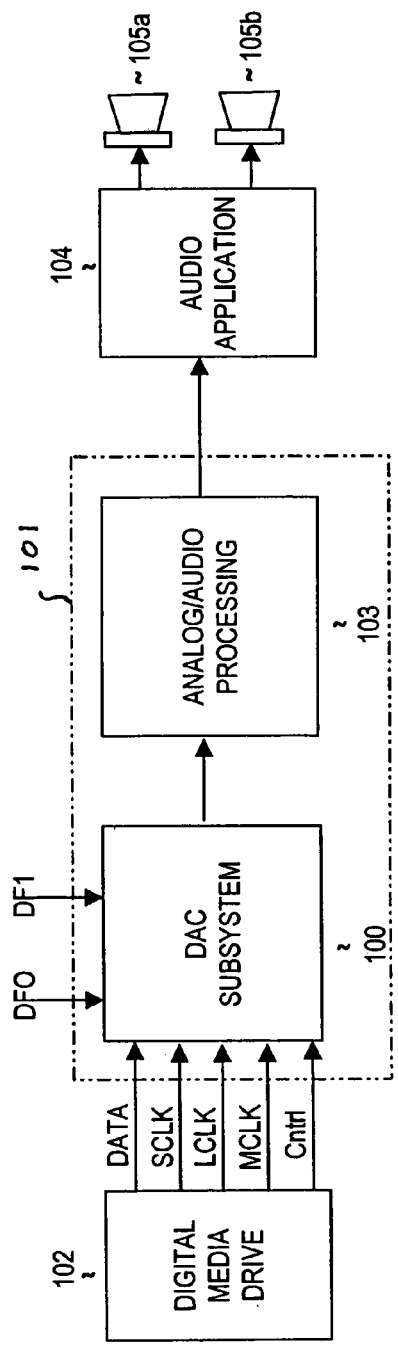
FIG. 1 is a diagram of a typical system application of 1-bit digital-to-analog converter (DAC) embodying the inventive principles.

FIG. 1 is a diagram of a typical system application of an 1-bit digital-to-analog converter (DAC) 100. In this example, DAC subsystem 100 forms part of an audio component, such as a compact disk (CD) player, digital audio tape (DAT) player, or digital video disk (DVD) unit. A digital media drive 102 recovers the digital data, such as 1-bit audio data in the Sony/Philips 1-bit format (the Super Audio Compact Disk or "SACD" format) from the given digital data storage media, and passes the data, along with clock and control signals, to DAC subsystem 100. The resulting analog (audio) data undergoes further processing in analog/audio circuit block 103 prior to amplification audio in amplifier block 104. Amplifier block 104 then drives a set of conventional speakers 105, a headset, or the like.

Multi-bit digital audio data may also be received serially through the SDATA pin and serial interface/format selector 101 timed by the sampling clock (SCLK) signal. The left and right channel data are alternately processed in response to the left-right clock (LRCK) signal. This clock signal is normally at the same rate as the data input rate (i.e., the sampling rate or "$F_s$"). Control signals DF1 and DF0 allow for the selection of the input format, such as right or left justified, 20-bit or 24-bit word width. When the input is 1-bit data, the SDATA port receives left channel data and the DF1 port right channel data.

Figure 2:
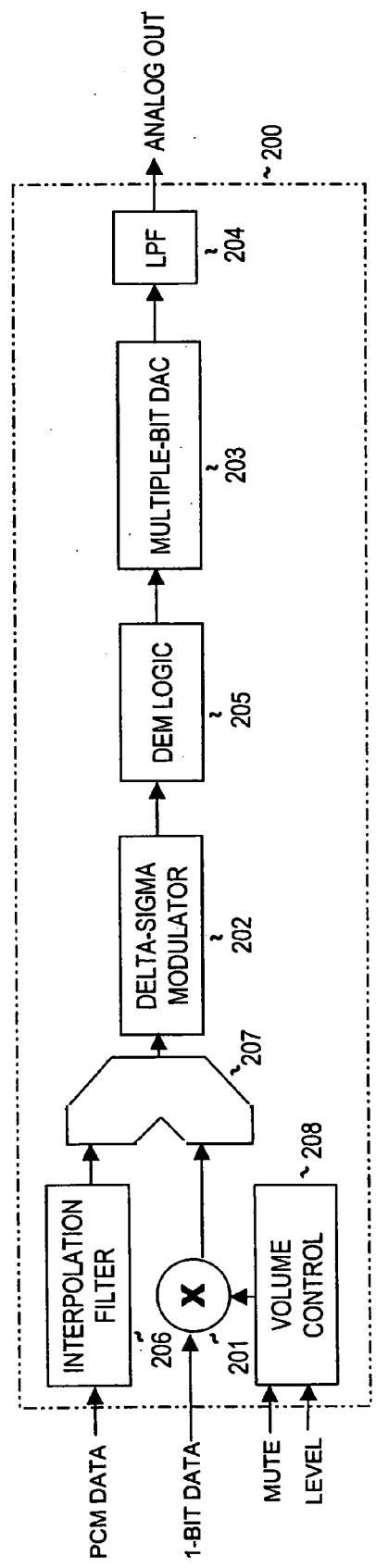
FIG. 2 is a block diagram of one channel of a representative DAC according to the principles of the present invention and suitable for use in the DAC subsystem of FIG. 1.

FIG. 2 is an operational block diagram of one channel of a DAC 200 according to the principles of the present invention and suitable for use in DAC subsystem 100 of FIG. 1. DAC 200 includes a gain stage (multiplier) 201 and a delta-sigma modulator 202, which re-codes and quantizes the output from multiplier 201. The m-level data output from modulator 201 is passed through a switched-capacitor, or other conventional multiple-bit DAC circuit 203, and converted into the analog domain. Analog low pass filter 204 then filters the analog signal. Dynamic element matching (DEM) logic 205 is provided between modulator 202 and DAC circuit 203 in the illustrated embodiment for shaping noise which results from DAC element mismatch. Multiplexer 207 selects between traditional multi-bit PCM data and single-bit data at the input of modulator 202.

Volume control circuitry 208, which is either a digital or analog circuit, converts the input control information into scaling (multiplication) factors for use by scaling stage 201. Volume control block 208 allows the volume to be ramped up or down, and/or provides a mute operation, in which the output is gracefully turned -on or off by the same ramping up and ramping down operations.

One measure of the performance of delta-sigma modulator 202 is the Modulator Index (MI), which represents the ability of the peak-to-peak amplitude of the output of modulator 202 to approach the high and low output power supply rails in response to the maximum allowable peak-to-peak input voltage swing during stable operation. Hence, if the output signal needs to be closer to the supply rails, then a higher MI is required. Low order modulators typically have a relatively high MI, although the noise shaping capability is generally poorer, and higher order modulators have a lower MI, although their noise shaping capability is significantly better.

To implement a stable pop-guard in a single-ended configuration, the input voltage should theoretically ramp from its lowest negative value to zero and the output consequently should theoretically ramp from ground to the middle of the power supply voltage range. However, since the modulator generally has a limited MI (i.e. less than 1.0), the output ramp starts exactly at ground and then experiences a sudden jump, such as example from ground to 5%–10% of the power supply voltage. This jump can cause an audible pop in the audio output of various audio applications. A similar jump from the minimum output level to ground can occur at the end of the ramp-down process.

According to the principles of the present invention, this problem is overcome, in one embodiment, by using a variable order delta-sigma modulator. Generally, a low order configuration with very high MI is utilized up to a given output voltage threshold, which allows the output ramp to start close to zero volts (ground). After the threshold has been reached, the modulator order is increased, (e.g., sequentially increased), such that during normal operations a high order configuration is used having the desired high order noise shaping. Conversely, during the ramp-down, the order is decreased until the output voltage threshold is reached, at which point the low order, high MI modulator configuration is utilized to reduce the output down as close to zero volts as possible.

Figure 3:
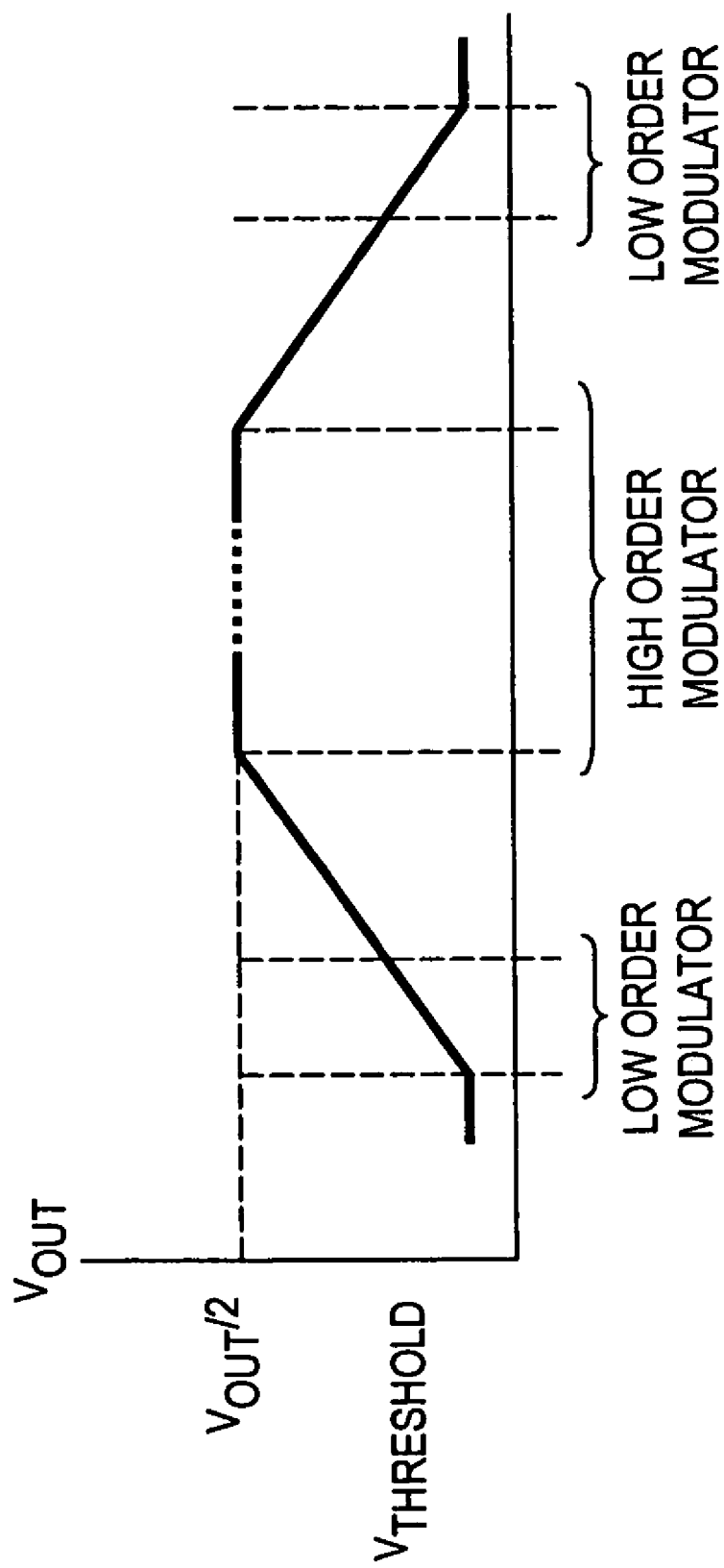
FIG. 3 is a plot of modulator output versus time, which graphically illustrates the process of varying modulator order during modulator output ramp-up and ramp-down according to one embodiment of the inventive principles.

The preferred operating process is illustrated graphically in FIG. 3, which is an approximate plot of the output voltage level $V_{Out}$ versus time. The threshold points ($V_{THRESHOLD}$) at which a change in order is triggered will vary based on the given modulator design. One possible threshold setting for switching from the lowest modulator order (i.e., 1) is:

$$Vout/2-(Vout/2*MI_{HighOrder})$$

For example, assume that the power supply voltage is nominally 5V and the MI is nominally 0.8 for the full order of the modulator. The output swing is therefore approximately 2.5±(2.5*0.8), which is 0.5 to 4.5 volts. Assuming that the modulator response is monotonic, the ramp with the low order, high MI modulator configuration would drive the output from 0 to 0.6 V and the higher order modulator configuration(s) from 0.6 to 2.5V. From this illustration, the corresponding input for the monotonic output response is determined such that the modulator order can be varied as a function of the input.

Figure 4:
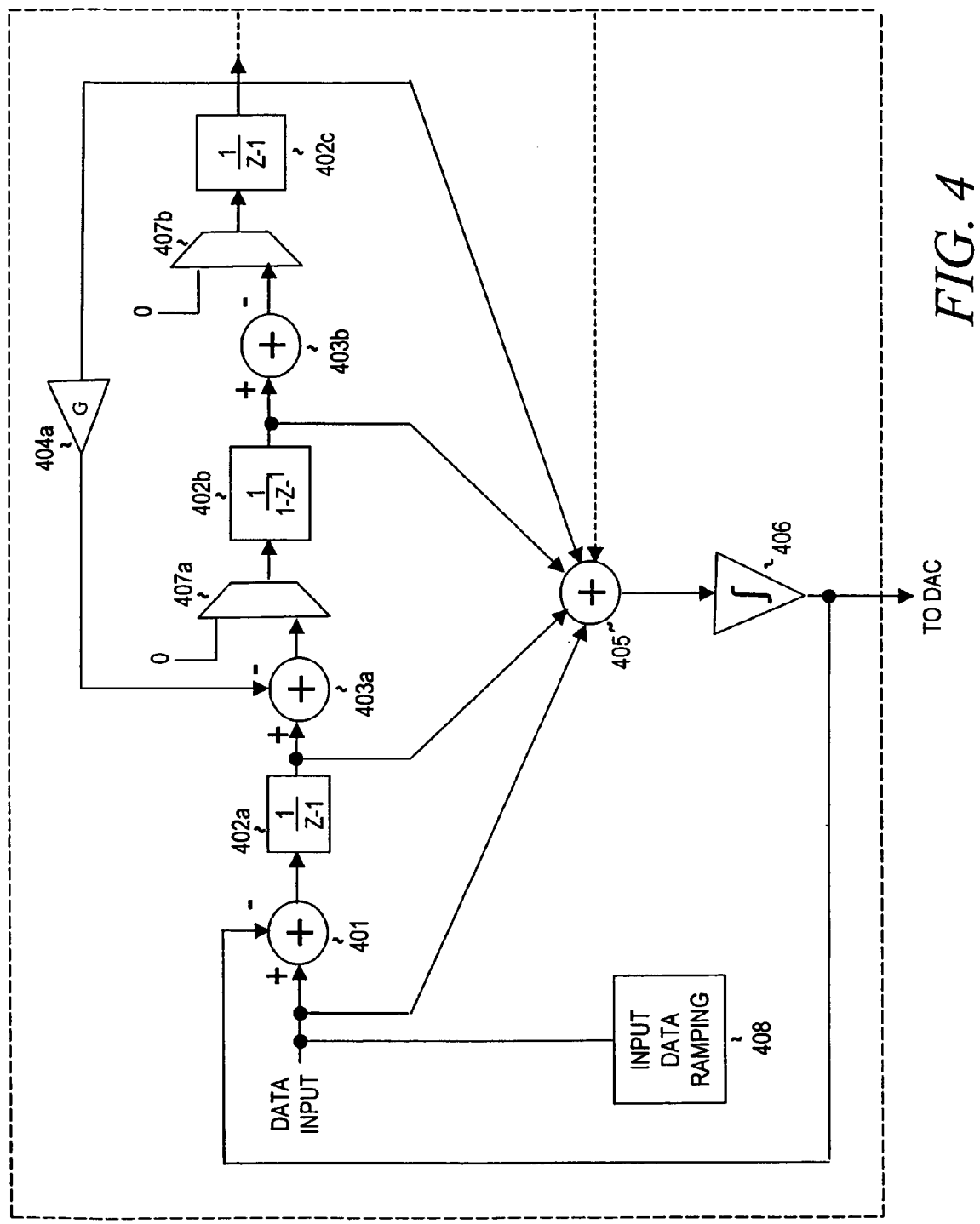
FIG. 4 is a block diagram of the first three stages of an exemplary $n^{th}$ order feedforward delta-sigma modulator embodying these concepts.

FIG. 4 is a block diagram of the first three stages of an $n^{th}$ order feedforward delta-sigma modulator 400 operating on a digital input stream and embodying these concepts. The order may change from specific design to specific design, depending on such factors as the required noise shaping response and stability concerns. Moreover, while a feedforward design operating on a digital input is shown, other designs can be used, including those operating on an analog input stream.

The input stream is received at the non-inverting input of input summer 401 and summed with a feedback signal received from a quantizer 406 at the summer inverting input. For an nth order modulator, modulator 400 includes n number of integrator stages 402, (e.g., integrator stages 402a, 402b, 402c), the outputs of which are summed by output summer 405. In the illustrated embodiment, the output of at least some integrator stages 402 (e.g. stage 402c) is fedback to an inverting summer 403 (e.g., summer 403a) of a previous stage through a gain stage 404 (e.g. gain stage 404a). The summed output from summer 405 is then requantized by quantizer 406 and sent to DAC 203 (see FIG. 2) and eventually to the output amplifiers.

In order to vary the order of the modulator, a set of multiplexers (selectors) 407 (e.g. multiplexers 407a, 406b) are provided between integration stages. To decrease the order of the modulator, selected integrator stages 402 (e.g. 402a, 402b, 402c) are, in effect, de-activated, preferrably starting with the last currently active stage in the chain, by switching the input of the selected stage or stages 402 from the output previous integrator stage to a logic zero (or 0 volts in the case of an analog modulator). The contribution of the deactivated stage(s) 402 at the summer 405 is effectively zero. To increase the modulator order, selected de-activated stage(s) 402 is/are, in effect, re-activated to the chain, preferrably beginning with the last currently active stage, by switching the corresponding input of the selected stages back to the output of the previous stage.

For the digital embodiment, the input is ramped-up and ramped-down in a manner similar to that used for volume control. For example, ramp control block 408 can step the digital input from a maximum negative signed digital value (corresponding to zero in the output voltage range) to a value corresponding to the midpoint in the output voltage range.

Figure 5:
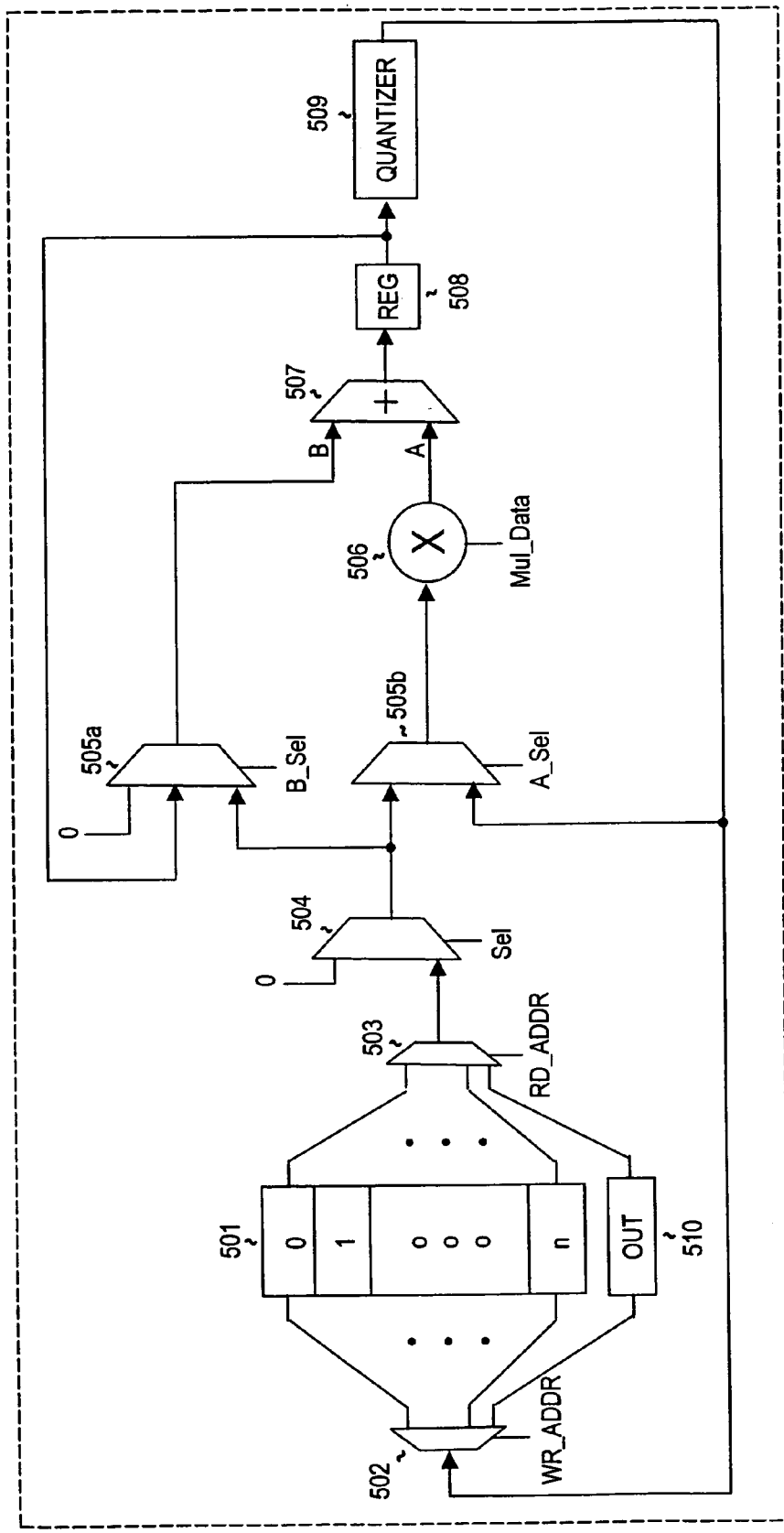
FIG. 5 illustrates an embodiment in which a register file or memory with n-number of entries is used to store and retrieve the digital values generated from the integration operations.

One particular digital implementation of delta-sigma modulator 400 is the digital signal processing (DSP) implementation illustrated in FIG. 5. In this implementation, a register file or memory system 501 with n-number of entries is utilized to store and retrieve the digital values generated from the integration operations. Data are written into the register entries though write multiplexer 502 in response to a write address ("WR_ADDR") signal and read from the register entries through read multiplexer 503 in response to a read address ("RD ADDR") signal.

A multiplexer 504 allows the order of the modulator to be changed by selecting between a logic zero (0) and the output of read multiplexer 503. The integration is logically implemented as a pair of multiplexers 505a, 505b, a multiplier 506, and an adder 507. A register ("REG") 508 and quantizer 509 complete the feedback loop.

When operating in the normal mode, variable-order modulator 400 does not have to operate at the highest order. For example, the MI of the modulator 400 may need or want to be dynamically changed during normal mode operations. The embodiments of modulators 400 allow this change to be done in a relatively straightforward manner. The final output is made available in output register 510 though the read and write multiplexers 502 and 503.

Figure 6:
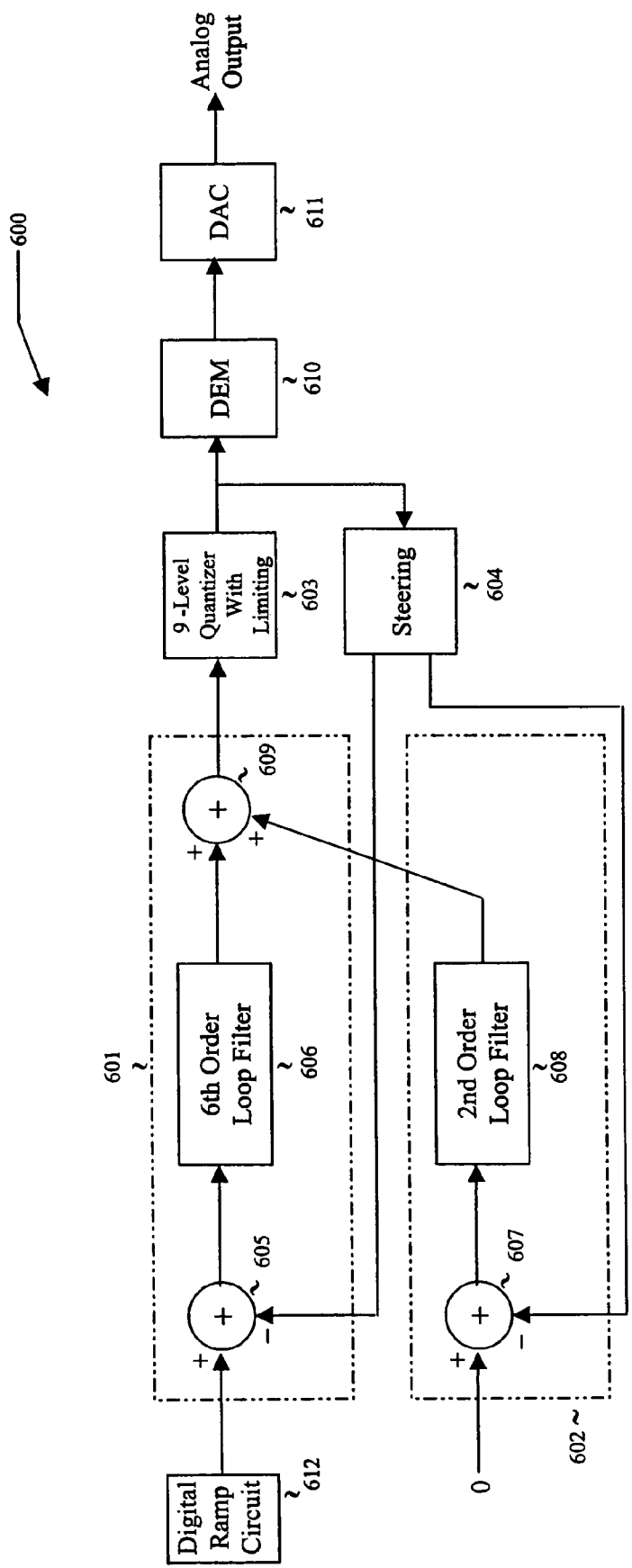
FIG. 6 is a block diagram of a delta-sigma modulator with steered feedback according to another embodiment of the principles of the present invention.

FIG. 6 is a high-level block diagram of an exemplary delta-sigma digital to analog converter (DAC) 600 with feedback steering according to another principles of the present invention. DAC 600 is also suitable for use in such applications as DAC subsystem 100 of FIG. 1. DAC 600 includes two delta-sigma loops 601 and 602 and a shared quantizer 603. Generally, primary delta-sigma loop 601 is a higher order data path which provides the desired noise shaping operation during normal (steady state) operation. Ramping delta-sigma loop 602 generally is a lower order data path with a high MI utilized during input ramp-up and ramp-down (transient) operations. Similar to the embodiments discussed above, by utilizing a high MI in ramping delta-sigma loop 602 during ramp-up and ramp-down, discontinuities in the modulator output signal are minimized since a high MI modulator allows the analog output to more closely approach the voltage rails.

Steering circuitry 604, which is further discussed below, controls the negative feedback from quantizer 603 to the inputs of delta-sigma loops 601 and 602. By steering the feedback to the inputs of loops 601 and 602, the amount of energy passed through the corresponding loop 601/602 is controlled.

In the illustrated embodiment of DAC 600, primary loop 601 is a sixth ($6^{th}$) order loop and includes an input summer 605, which sums the digital input signal with negative feedback from steering circuitry 604, and a sixth ($6^{th}$) order primary loop filter 606. Primary loop filter 606 may have a conventional topology, such as a feedforward or feedback topology. A general discussion of the design and construction of various delta-sigma loop filter topologies are found in various publications such as Norsworthy et al., *Delta-Sigma Data Converters, Theory, Design and Simulation*, IEEE Press, 1996.

Exemplary ramping delta-sigma modulator loop 602 is a second ($2^{nd}$) order loop and includes an input summer 607 summing a fixed input value (in this case zero) with feedback from steering circuitry 604 and a second ($2^{nd}$) order loop filter 608. Second ($2^{nd}$) order delta-sigma loops having a high MI are generally straightforward to implement. Furthermore, second ($2^{nd}$) order delta-sigma modulators are known to be stable under overload conditions.

The outputs of primary loop 601 and ramping loop 602 are summed by summer 609, and the summed output from summer 609 is fed into shared quantizer 603. Steering circuitry 604 controls two feedback streams: one stream from the output of shared quantizer 603 to input summer 605 of primary loop 601 and another stream to input summer 607 of ramping loop 602. The output stream from quantizer 603, which is equal to the sum of the energy of the two feedback streams, drives a conventional switched-capacitor or current steering DAC 611 through dynamic element matching (DEM) circuitry 610. DAC 611 typically has eight (8) DAC elements, which are nominally equivalent to each other, and DEM 610 guarantees equal usage of these DAC elements to remove noise due to element mismatch.

In normal operation, the output from quantizer 603 remains above the threshold valve $V_{Threshold}$ and therefore steering circuitry 604 directs the majority of the feedback signal from quantizer 603 to primary loop 601. A minimal amount of feedback signal is returned to the input of low order modulator loop 602. Consequently, primary loop filter 601 provides the high order filtering of the input signal filtering operations and is stable.

As the input to modulator loop 601 ramps-up or ramps-down, and the output voltage approaches $V_{Threshold}$, from below $V_{Threshold}$ in the case of ramping-up and from above $V_{Threshold}$ in the case of ramping-down, steering circuitry 604 steers sufficient negative feedback signal to the input of primary loop 601 to maintain the stability of primary loop 601. At the same time, more feedback energy, either positive or negative energy, is sent to the negative input of summer 607 of low-order, high MI, ramping loop 602. The total feedback energy from feedback steering circuitry 604 remains equal to the value from quantizer 603.

In the illustrated embodiment, nine (9) level limiting quantizer 603 has an output range between a negative four (−4) and a positive four (+4). When the digital input to modulator 600 from ramping circuitry 612 is at or close to the maximum negative level, high order loop filter 606 requires sufficient feedback values into input summer 605 such that the output from quantizer 603 tracks the average value of the digital input into primary loop 601. To remain stable and still track the negative four (−4) average input, the feedback into input summer 605 must therefore include at least some quantized values below minus four (4), even though the maximum negative quantized value available from nine level limiting quantizer 603 is minus four (−4). Therefore, steering circuitry 604 ensures that high order loop 601 receives sufficient feedback to remain stable while the input is close to its maximum negative input (overload) level by providing an offsetting amount of feedback energy to ramping path 602. For example, if limiting quantizer 603 clips its output at a value of minus 4 (−4), but the input to primary loop 601 requires feedback values of minus 5 (−5) to maintain stability, steering circuitry 604 feeds back a stream with a value of minus 5 (−5) to the input of primary loop 601 and a compensating stream with a value of minus 1 (−1) to the input of overload loop 602. The total value out of feedback steering circuitry 604 thus remains equal to the value from quantizer 603, which, in this example, is minus four (−4). In order to minimize signal degradation under overload conditions, the operation of steering circuitry 604 guarantees that the two outputs from steering circuitry 604 sum to the output of quantizer 603. High MI ramping loop 602 therefore controls the transition of the output of modulator 600 between zero volts or ground and the threshold value $V_{Threshold}$, at which point primary loop 601 stably operates stabily.

Figure 7:
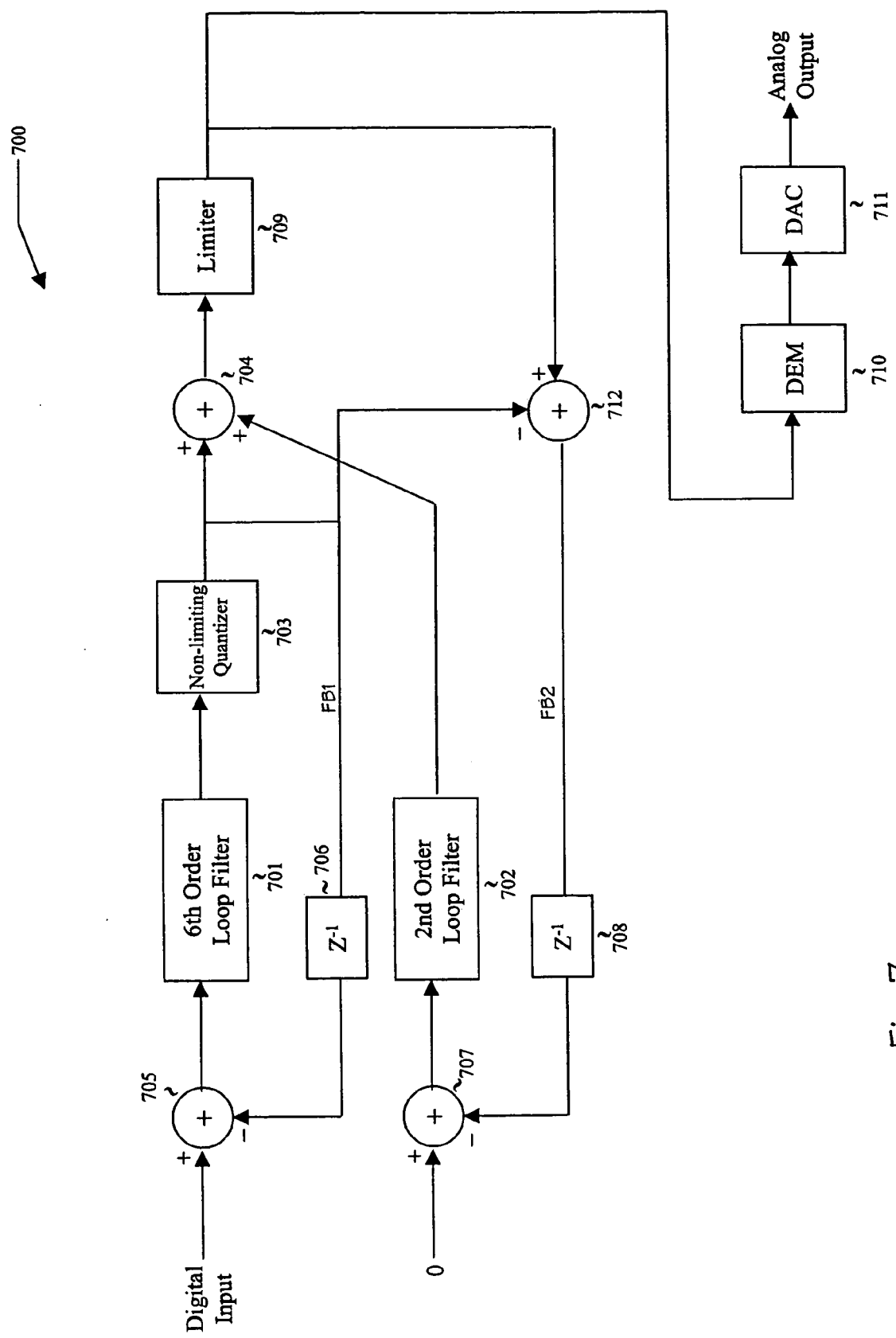
FIG. 7 is a block diagram of a particular exemplary implementation of the delta-sigma modulator of FIG. 6.

A number of ways exist for implementing feedback steering overload compensation, such as shown in DAC 600 of FIG. 6. FIG. 7 is an operational block diagram depicting one particular exemplary delta-sigma DAC 700 with feedback steering overload control. Delta-sigma DAC 700 includes a high-order primary loop filter 701 and a low-order (unconditionally stable) overload loop filter 702. For illustrative purposes, primary loop filter 701 is a sixth ($6^{th}$) order filter, and low-order filter 702 is a second ($2^{nd}$) order filter. Again, a second ($2^{nd}$) order topology is selected for low order filter 702 since second ($2^{nd}$) order loop filters are provably stable under overload conditions.

Primary $6^{th}$ order loop filter 701 provides the high quality filtering of the input signal under normal (low level) operating conditions. The signal output of primary loop filter 701 is quantized by a non-limiting quantizer 703, which in turn has an output that feeds one input to summer 704. Summer 704 follows quantizer 703, as the output of a simple second order loop filter is also an integer since the input is always driven with an integer and hence does not participate in the truncation. The output of non-limiting quantizer 703 also provides negative feedback to input summer 705 to close the primary delta-sigma modulator loop, which also includes a delay ($Z^{-1}$) block 706 for signal timing.

A second input to summer 704 is fed by the output overload filter 702. The input to overload filter 702 provided by a corresponding input summer 707. One input to input summer 707 is a fixed value, such as a logical zero (0) in this example. The other input to summer 707 receives negative feedback from the output of overload filter 702, delayed by delay ($Z^{-1}$) element 708.

The sum of the outputs from respective primary and overload filters 701 and 702 generated by summer 704 is sent to a limiter 709 which performs a clipping (truncation) operation. The resulting output signal from limiter 709 drives DEM circuitry 710 and DAC 711 at the output of DAC 700.

The feedback to input summer 707 is generated by summer 712. The inverting (negative (−)) input signal FB1 to summer 712 is driven by the output of non-limiting quantizer 703. The non-inverting (positive (+)) input of summer 712 is driven by the output of limiter 709.

As long as the output from non-limiting quantizer 703 remains below the maximum (positive to negative) output from limiter 709, the overload feedback signal FB2 from summer 712 remains at zero (0). The majority of the energy is therefore passed through high-quality, $6^{th}$ order loop filter 701. On the other hand, as the output from quantizer 703 exceeds the positive or negative maximum output values from limiter 709, the overload feedback signal FB2 from summer 712 increases accordingly. The full feedback signal FB1 from non-limiting quantizer 703 to the input of sixth ($6^{th}$) order loop filter 701 maintains $6^{th}$ order loop filter 701 stable by insuring that the stages of loop filter 701 do not saturate. The overload (ramping) feedback signal FB2 to the input of second ($2^{nd}$) order filter 702 ensures that more energy is sent through loop filter 702, which remains stable under overload conditions. The total feedback into summers 705 and 707 equals the output from limiter 709.

Other steering mechanisms may also be used in alternate embodiments of the present invention, such as a system that uses the overload (ramping) filter path only when overload is severely affecting the operation of the main loop filter, but allows short, transient overloads to be clipped in the quantizer. Additionally, the feedback steering may be based upon the level of the input signal.

The principles of the present invention were described above with respect to exemplary digital delta-sigma modulators in exemplary DACs 600 and 700. Feedback steering overload control according to these principles, however, are also applicable to analog delta-sigma modulators and related applications such as analog to digital converters. Additionally, the feedback steering may be based upon the level of the input signal.

In sum, modulator 600 smoothly transitions from second ($2^{nd}$) order to sixth ($6^{th}$) order during input signal ramping, in contrast to switching directly between second ($2^{nd}$) and sixth ($6^{th}$) order modes. Advantageously, this smooth transition helps hide any artifacts arising from mode switching operations.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims. It is therefore, contemplated that the claims will cover any such modifications or embodiments that fall within the true scope of the invention.

What is claimed is:

1. A digital to analog converter, comprising:
   an input for receiving an input signal;
   a ramp generator; and
   a delta-sigma modulator responsive to the input signal and an output of the ramp generator, wherein an order of a noise shaping transfer function of the delta-sigma modulator is response to a level of the output of the ramp generator.

2. The digital to analog converter of claim 1, wherein the delta-sigma modulator comprises:
   a shared quantizer;
   a data path coupled to the shared quantizer for filtering an input signal;
   another data path coupled to the shared quantizer for driving the quantizer during ramping of the input signal; and
   steering circuitry controlling a contribution of the another data path into the shared quantizer responsive to the ramp generator.

3. The digital to analog converter of claim 2, wherein:
   the data path and the another data path each include a loop filter of a selected order, the order of the loop filter of the data path being greater than the order of the loop filter of the another data path.

4. The digital to analog converter of claim 2, wherein the another data path has a modulation index greater than a modulation index of the data path.

5. The digital to analog converter of claim 2, wherein the steering circuitry controls the contribution of the another data path into the shared quantizer by controlling feedback to the another data path.

6. The digital to analog converter of claim 2, wherein the shared quantizer comprises a limiting quantizer and the modulator further comprises a summer for summing contributions from the data path and the another data path into an input of the shared quantizer.

7. The digital to analog converter of claim 2, wherein the shared quantizer comprises;
- a non-limiting quantizer having an input coupled to an output of the data path;
- a summer for summing an output stream from the non-limiting quantizer and an output stream from the another data path; and
- a limiter coupled to an output of the summer.

8. The digital to analog converter of claim 7, wherein the steering circuitry comprises:
- a feedback path from an output of the non-limiting quantizer to an input of the data path and an input of a feedback summer;
- a path from an output of the limiter and an input of the feedback path summer, the feedback summer taking a difference between a data stream output from the limiter and the output from the non-limiting quantizer; and
- a feedback path from an output of the feedback summer to an input of the another data path.

9. A method of performing delta-sigma modulation, comprising:
- receiving an input signal;
- selectively ramping the input signal; and
- in response to selectively ramping the input signal, varying an order of a noise shaping transfer function of a delta-sigma modulator.

10. The method of claim 9, wherein varying the order of the noise shaping transfer function comprises:
- sharing a quantizer of the modulator with a data path and another data path;
- driving the shared quantizer with the data path during filtering of an input signal; and
- driving the shared quantizer with another data path during ramping of the input signal.

11. The method of claim 10, wherein driving the shared quantizer with another data path comprises varying feedback from the shared quantizer to the another data path during ramping of the input signal.

12. The method of claim 10, wherein driving the shared quantizer comprises driving the shared quantizer with a selected modulation index during filtering and driving the shared quantizer with a higher modulation index during ramping of the input signal.

13. The method of claim 10, wherein driving the shared quantizer with the data path during filtering of the input signal comprises filtering the input signal with a loop filter of a selected order and driving the shared quantizer with the another data path during ramping of the input signal comprises driving the shared quantizer with a loop filter of a lower order.

14. The method of claim 10, wherein varying feedback from the shared quantizer to the another path comprises providing feedback to the data path and the another data path such that a sum of the feedback to the data path and the another data path equals an output of the shared quantizer.

15. The method of claim 10, wherein sharing a quantizer comprises;
- summing output streams from the data path and the another data path; and
- quantizing a sum of the output streams in a limiting quantizer.

16. The method of claim 10, wherein sharing a quantizer comprises
- quantizing an output of the data path with a non-limiting quantizer;
- summing an output stream from the non-limiting quantizer and an output stream from the another data path; and
- limiting an output stream from the summer to generate a limited output stream.

17. The method of claim 16, wherein varying feedback from the shared quantizer to the another data path during ramping of the input signal comprises:
- feeding-back an output of the non-limiting quantizer to an input of the data path;
- taking a difference between the limited output stream and the output from the non-limiting quantizer; and
- feeding-back the difference between the limited output stream and the output from the non-limiting quantizer to the another data path.

18. An audio system, comprising:"
- ramping circuitry for scaling an input data stream; and
- a delta-sigma modulator receiving a scaled input stream from the ramping circuitry, the delta-sigma modulator comprising:
  - a shared quantizer;
  - a first data path coupled to the shared quantizer and having an order selected for filtering the scaled input stream;
  - a second data path coupled to the shared quantizer for driving the quantizer during scaling of the input signal; and
  - steering circuitry for controlling a contribution of the second data path into the shared quantizer during scaling of the input signal.

19. The audio system of claim 18, wherein the ramping circuitry scales the input data stream during volume changes.

20. The audio system of claim 18, wherein the ramping circuitry scales the input data stream during power supply changes in the audio system.

21. The audio system of claim 18, wherein the delta-sigma modulator forms a portion of an analog to digital converter.

22. The audio system of claim 18, wherein the delta-sigma modulator forms a portion of a digital to analog converter.

* * * * *